US012593454B2

(12) United States Patent
Chen et al.

(10) Patent No.: US 12,593,454 B2
(45) Date of Patent: Mar. 31, 2026

(54) FERROELECTRIC TUNNEL JUNCTION STRUCTURE WITH L-SHAPED SPACERS

(71) Applicant: Taiwan Semiconductor Manufacturing Company, Hsinchu (TW)

(72) Inventors: Tzu-Yu Chen, Kaohsiung (TW); Kuo-Chi Tu, Hsinchu (TW); Sheng-Hung Shih, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 371 days.

(21) Appl. No.: 18/195,689

(22) Filed: May 10, 2023

(65) Prior Publication Data

US 2024/0381658 A1    Nov. 14, 2024

(51) Int. Cl.
| | |
|---|---|
| *H10B 51/30* | (2023.01) |
| *H10D 30/01* | (2025.01) |
| *H10D 30/69* | (2025.01) |
| *H10D 64/68* | (2025.01) |

(52) U.S. Cl.
CPC ......... *H10B 51/30* (2023.02); *H10D 30/0415* (2025.01); *H10D 30/701* (2025.01); *H10D 64/689* (2025.01)

(58) Field of Classification Search
CPC .. H10B 51/30; H10D 50/0415; H10D 30/701; H10D 64/689
See application file for complete search history.

(56) References Cited

U.S. PATENT DOCUMENTS

| | | | |
|---|---|---|---|
| 2020/0105772 A1* | 4/2020 | Chen ....................... | H10B 53/30 |
| 2021/0313439 A1* | 10/2021 | Lee .................... | H10D 30/6739 |

* cited by examiner

*Primary Examiner* — Richard A Booth
(74) *Attorney, Agent, or Firm* — Lippes Mathias LLP

(57) ABSTRACT

A ferroelectric tunnel junction (FTJ) includes bottom and top electrodes and a ferroelectric layer disposed between the bottom and top electrodes. A dielectric material is disposed in a space between a peripheral area of the ferroelectric layer and a sidewall of the top electrode. At least one conformal dielectric spacer is deposited. The FTJ is annealed to induce ferroelectric phase crystallization in the ferroelectric layer. The depositing at least one conformal dielectric spacer includes at least one of: (i) prior to the disposing of the dielectric material, depositing an inner conformal dielectric spacer on the peripheral area of the ferroelectric layer and on the sidewall of the top electrode, and/or (ii) after the disposing of the dielectric material, depositing an outer conformal dielectric spacer on dielectric material and on a sidewall of the peripheral area of the ferroelectric layer.

20 Claims, 11 Drawing Sheets

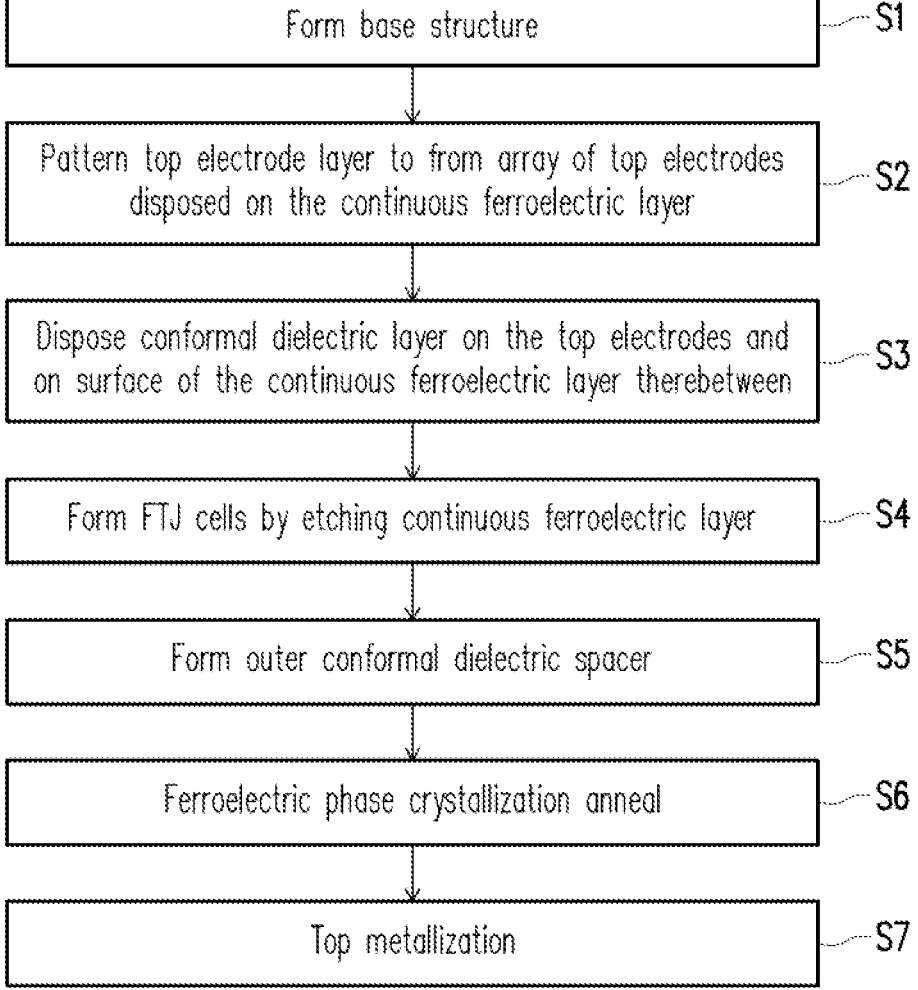

| Form base structure | — S1 |

| Pattern top electrode layer to from array of top electrodes disposed on the continuous ferroelectric layer | — S2 |

| Dispose conformal dielectric layer on the top electrodes and on surface of the continuous ferroelectric layer therebetween | — S3 |

| Form FTJ cells by etching continuous ferroelectric layer | — S4 |

| Form outer conformal dielectric spacer | — S5 |

| Ferroelectric phase crystallization anneal | — S6 |

| Top metallization | — S7 |

FIG. 6

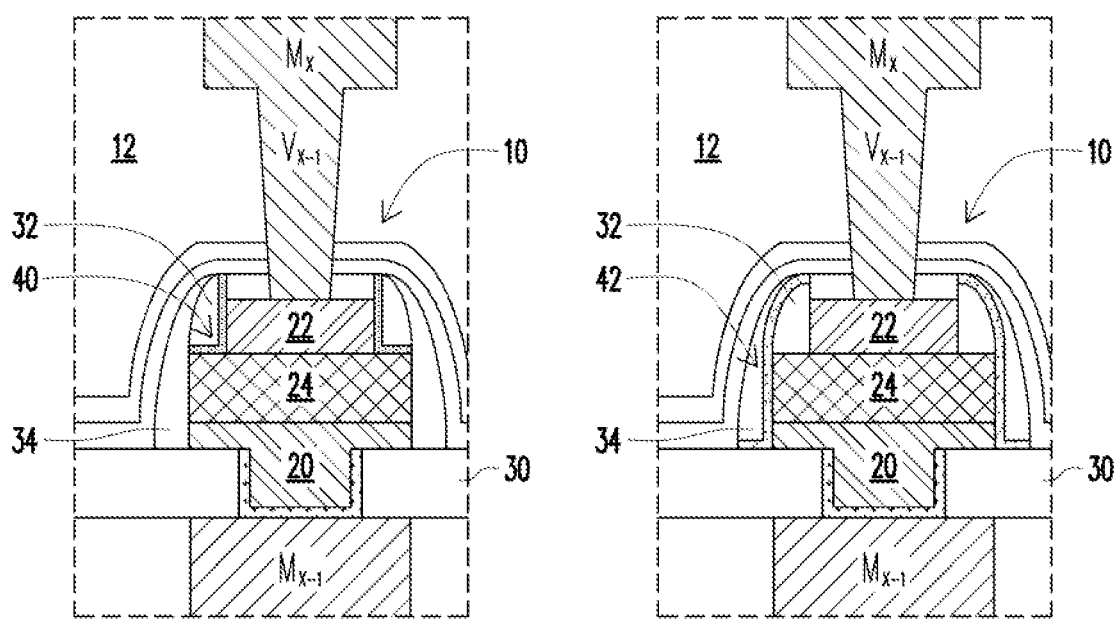
FIG. 21                    FIG. 22
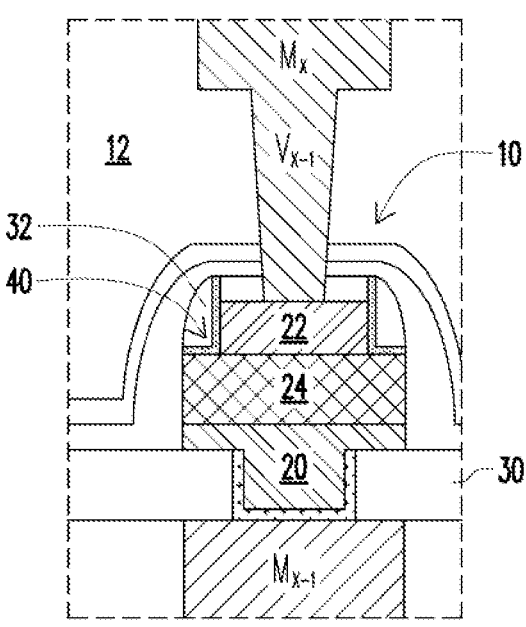
FIG. 23

FERROELECTRIC TUNNEL JUNCTION STRUCTURE WITH L-SHAPED SPACERS

BACKGROUND

The following relates to the integrated circuit (IC) arts, ferroelectric tunnel junction (FTJ) arts, ferroelectric random access memory (FeRAM) arts, and related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 diagrammatically shows by way of a flowchart an FTJ cell fabrication method in accordance with a nonlimiting illustrative embodiment.

FIGS. 21-27 diagrammatically illustrate cross-sectional views of FTJ cells in accordance with further nonlimiting illustrative embodiments.

DETAILED DESCRIPTION

Figure 1:
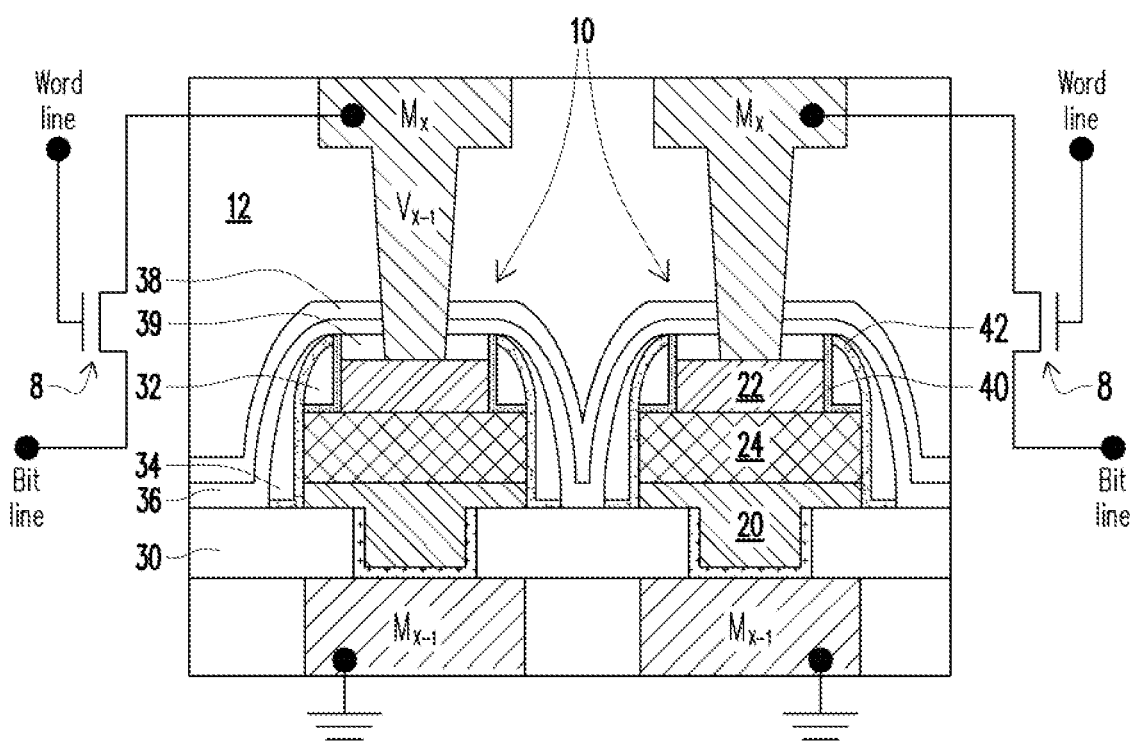
FIG. 1 diagrammatically illustrates a cross-sectional view of two ferroelectric tunnel junction (FTJ) cells in accordance with a nonlimiting illustrative embodiment, along with a diagrammatically indicated transistors operatively connected with the FTJ cells to form ferroelectric random access memory (FeRAM) cells.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A ferroelectric tunnel junction (FTJ) includes a thin ferroelectric layer made of a ferroelectric material, which is interposed between top and bottom electrodes. The remnant polarization of the ferroelectric layer can be switched between a positive remnant polarization often denoted as +Pr and a negative remnant polarization often denoted as −Pr. The electrical resistance of electrical current tunneling through the FTJ depends strongly on the polarization (+Pr or −Pr), so that measurement of current flow through the FTJ enables readout of the stored remnant polarization. The change in polarization between the +Pr state (which may, for example encode either a logical "1" or a logical "0") and the −Pr state (which then encodes the other of logical "0" or logical "1") is 2Pr. The plurality of layers making up the FTJ may include an additional interfacial layer that is interposed between the top and bottom electrodes and is in contact with the ferroelectric layer. The interfacial layer is chosen to engineer the characteristics of the tunnel barrier. A ferroelectric random access memory (FeRAM) includes a FTJ and a transistor, such as a field-effect transistor (FET), which is used to read and write bit values to the FeRAM which serves as nonvolatile storage for the FeRAM.

The fabrication process for fabricating an FTJ includes forming the plurality of layers (top and bottom electrodes with the ferroelectric layer and optional interfacial layer interposed therebetween) and annealing the plurality of layers at a temperature high enough to induce ferroelectric phase crystallization in the ferroelectric material of the ferroelectric layer. However, ferroelectric crystallization can be more difficult at the periphery of the ferroelectric layer. Less effective ferroelectric phase crystallization at the periphery of the ferroelectric layer can lead to local variation of the 2Pr value across the area of the ferroelectric layer, and the resulting nonuniformity in the ferroelectric phase percentage across the ferroelectric layer can in turn lead to nonoptimal FTJ performance, including problems such as electrical current leakage, variable capacitance, and/or so forth.

Without being limited to any particular theory of operation, it is believed ferroelectric phase crystallization during the annealing may be promoted by stress imposed on the ferroelectric layer by a difference in the coefficient of thermal expansion (CTE) of the ferroelectric material and the CTE of surrounding material, notably the top and bottom electrodes. As the top electrode may not cover the entire area of the ferroelectric layer, this can be expected to result in reduced CTE difference-induced stress at the periphery of the ferroelectric layer, leading to the annealing being less effective at inducing ferroelectric phase crystallization at the periphery.

Another challenge in fabrication of FTJs and associated devices such as FeRAM arrays is achievement of effective isolation of the FTJ from neighboring devices, such as integrated circuitry located at the periphery of an FeRAM array. Sidewalls of the FTJ are typically coated with a dielectric layer, but may be insufficient to avoid electromagnetic interference in the FTJ operation from peripheral devices.

In embodiments disclosed herein, these problems are addressed by disposing a conformal dielectric spacer the peripheral area of the ferroelectric layer that surrounds the top electrode. The conformal dielectric spacer may be made of a material such as tantalum oxide (TaO) or another metal oxide, which has a large difference in CTE compared with the ferroelectric layer which may, for example, comprise hafnium zinc oxide (HZO). The conformal dielectric spacer may also coat a sidewall of the top electrode, thus having an L-shaped cross-section. Additionally or alternatively, an outer conformal dielectric spacer may be provided, such as a TaO or other metal oxide spacer, disposed on a sidewall of the FTJ including on a sidewall of the ferroelectric layer. The conformal dielectric spacer or spacers are expected to improve ferroelectric phase crystallization during the annealing by imposing additional stress on the peripheral area of the ferroelectric layer due to the difference between the CTE of the conformal dielectric spacer and the CTE of the ferroelectric layer. As a non-limiting illustrative example, HZO has a CTE of about 30 $\mu m/(m \cdot K)$ while TaO has a CTE of about 3.6 $\mu m/(m \cdot K)$, that is, a large difference in CTE of about 88%. Furthermore, the conformal dielectric spacer or spacers are expected to improve isolation of the FTJ from peripheral devices by providing additional material coating the sidewall of the FTJ including the sidewall of the ferroelectric layer. Thus, the conformal dielectric spacer(s) advantageously isolate the FTJ cells from periphery devices, presenting the FTJ-based memory from being affected by logic processes.

With reference to FIG. 1, a diagrammatic cross-sectional view is shown of two ferroelectric tunnel junction (FTJ) cells 10 along with a diagrammatically indicated transistors 8 operatively connected with the FTJ cells 10 to form ferroelectric random access memory (FeRAM) cells. Each FTJ 10 is formed between a lower metallization layer denoted as $M_{x-1}$ and an upper metallization layer denoted as $M_x$. The metallization layer $M_{x-1}$ is "lower" than the metallization layer $M_x$ in that the metallization layer $M_{x-1}$ is closer to the semiconductor substrate (not shown; e.g., a silicon wafer in some nonlimiting illustrative examples) than is the metallization layer $M_x$. In some nonlimiting illustrative embodiments, the metallization layers $M_{x-1}$ and $M_x$ are patterned layers of copper or copper alloy layers forming electrical traces of an integrated circuit (IC) formed on and/or in the semiconductor substrate. In some nonlimiting illustrative examples, the metallization layers $M_{x-1}$ and $M_x$ may be metallization layers of middle end-of-line (MEOL) processing or back end-of-line (BEOL) processing of the overall IC manufacturing process. The metallization layers are formed in or surrounded or encapsulated by an inter-metal dielectric (IMD) material 12. The IMD material 12 may, by way of some nonlimiting illustrative examples, comprise polysilicon, silicon oxide, silicon nitride, silicon oxynitride, phosphosilicate glass (PSG), borophosphosilicate glass (BPSG), spin-on glass (SOG), fluoride-doped silicate glass (FSG), carbon doped silicon oxide (SiCOH), polyimide, amorphous fluorinated carbon, bis-benzocyclobutenes (BCB), hydrogen silsesquioxane, fluorinated silicon oxide (SiOF), and/or combinations thereof.

The FTJ 10 comprises a bottom electrode 20, a top electrode 22, and a ferroelectric layer 24 disposed between the bottom electrode 20 and the top electrode 22. In some embodiments, the FTJ further includes an interfacial layer (not shown) that is also disposed between the bottom electrode layer 20 and the top electrode layer 22 and is in contact with the ferroelectric layer 24. The interfacial layer, if included, promotes electrical carrier tunneling and may be chosen to optimize performance of the FTJ 10. Moreover, in some embodiments the ferroelectric layer 24 could be a stack of two or more ferroelectric layers spaced apart by interfacial layers. The bottom and top electrodes 20 and 22 can be, for example, titanium nitride (TiN) or a TiN/tantalum nitride (TaN) stack, by way of nonlimiting illustrative example.

In the illustrative example of FIG. 1, the bottom electrodes 20 of the FTJs 10 are formed in and on a silicon carbide (SiC) layer 30, and the FTJ cells 10 may further include one or more spacers, such as silicon nitride (SiN) spacers 32 and 34 and encapsulation by a SiC layer 36 and an outermost tetraethoxysilane (TEOS) 38. A top SiON layer 39 is also disposed over the top electrode 22. This is merely an illustrative example of one approach for FTJ encapsulation.

Figure 2:
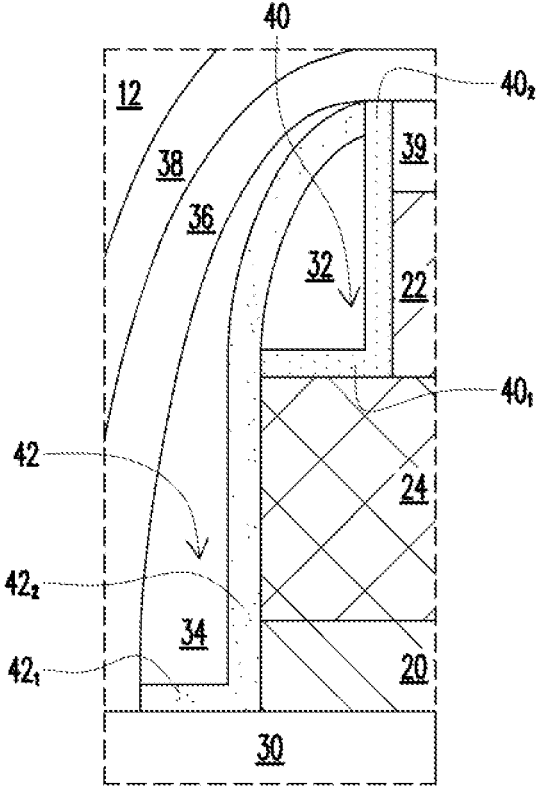
FIG. 2 diagrammatically illustrates an enlarged cross-sectional view of a portion of one of the FTJ cells of the embodiment of FIG. 1.

With continuing reference to FIG. 1 and with further reference to FIG. 2 which shows an enlarged cross-sectional view of a portion of one FTJ cell 10 of the embodiment of FIG. 1, the FTJs 10 each include one or more (illustrative two) conformal dielectric spacers 40 and 42. The illustrative spacers include an inner conformal dielectric spacer 40 and an outer conformal dielectric spacer 42. In the cross-sectional view of FIG. 1, each spacer 40 and 42 has an L-shaped cross-section. The inner and outer spacers 40 and 42 are conformal in that each conformal dielectric spacer 40 and 42 is a thin layer (e.g., having a thickness of between 0.5 nanometer and 10 nanometer in some nonlimiting illustrative embodiments) that is deposited as a continuous layer that conforms with the shape of the surface onto which it is deposited. By contrast, the dielectric spacer 32 is nonconformal and fills the space defined between a horizontal leg $40_1$ and a vertical leg $40_2$ of the L-shaped inner dielectric spacer 40, and similarly the dielectric spacer 34 is nonconformal and fills a space defined by a horizonal leg $42_1$ and a vertical leg $42_2$ of the L-shaped outer dielectric spacer 42. Note that the horizontal and vertical legs $40_1$, $40_2$, $42_1$, and $42_2$ are labeled only in the enlarged view of FIG. 2. In some nonlimiting illustrative embodiments, the horizontal leg $40_1$ of the L-shaped inner dielectric spacer 40 has a dimension of around 5-60 nanometers in extent away from the top electrode 22, and the vertical leg $40_2$ of the L-shaped inner dielectric spacer 40 has a height of 20-100 nanometers. In some nonlimiting illustrative embodiments, the horizontal leg $42_1$ of the L-shaped outer dielectric spacer 42 has a dimension of around 5-60 nanometers in extent away from the sidewall of the ferroelectric layer 24. These are merely nonlimiting illustrative example dimensions.

Figure 3:
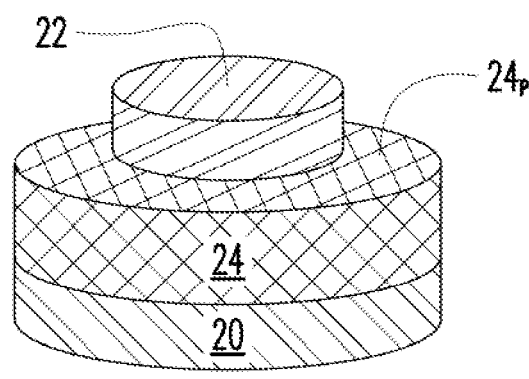
FIG. 3 diagrammatically illustrates a perspective isolation view of the bottom electrode, ferroelectric layer, and top electrode of one FTJ cell of the embodiment of FIGS. 1 and 2.
Figure 4:
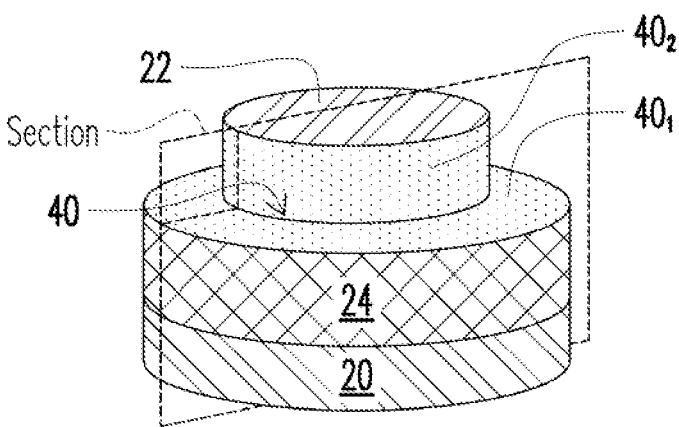
FIG. 4 diagrammatically illustrates a perspective isolation view of the bottom electrode, ferroelectric layer, top electrode, and inner conformal dielectric spacer of one FTJ cell of the embodiment of FIGS. 1 and 2.
Figure 5:
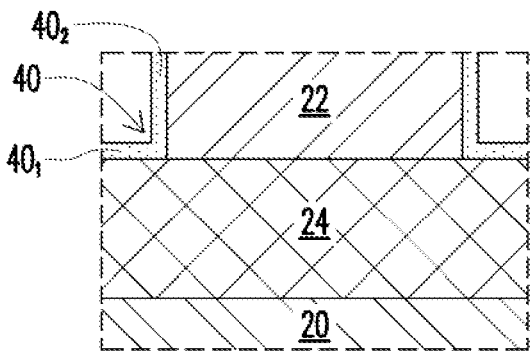
FIG. 5 illustrates a cross-sectional view corresponding to the "Section" indicated in FIG. 4.

With reference now to FIGS. 3, 4, and 5, the structure of the inner conformal dielectric layer 40 is described in further detail. FIG. 3 diagrammatically shows an isolation perspective view of the bottom electrode 20, the ferroelectric layer 24, and the top electrode 22. As there seen, the top electrode does not fully cover the ferroelectric layer 24. Hence, the ferroelectric layer 24 has a peripheral area $24_P$ which is not covered by the top electrode 22 and which surrounds a sidewall or perimeter of the top electrode 22. FIG. 4 diagrammatically shows an isolation perspective view of the bottom electrode 20, the ferroelectric layer 24, the top electrode 22, and the inner conformal dielectric layer 40. A "Section" of this structure is also shown, and FIG. 5 shows a section view corresponding to the "Section" indicated in FIG. 4. As illustrated in FIGS. 4 and 5, the L-shaped cross-section of the inner conformal dielectric spacer 40 in the sectional view of FIG. 5 includes the first (e.g. horizontal) leg $40_1$ corresponding to the first portion $40_1$ of the conformal dielectric spacer 40 which as best seen in FIG. 4 is disposed on the peripheral area $24_P$ (see FIG. 3) of the ferroelectric layer 24 (where again as seen in FIG. 3 the peripheral area $24_P$ of the ferroelectric layer 24 is not covered by the top electrode 22 and surrounds a sidewall or perimeter of the top electrode 22). Because the first portion $40_1$ of the conformal dielectric spacer 40 is disposed on the peripheral area $24_P$ of the ferro electric layer 24, the first portion $40_1$ of the conformal dielectric spacer 40 is also referred to herein as a peripheral conformal spacer $40_1$. The L-shaped cross-section of the inner conformal dielectric spacer 40 in the sectional view of FIG. 5 further includes the second (e.g. vertical) leg $40_2$ corresponding to a second portion $40_2$ of the conformal dielectric spacer 40 which is disposed on the sidewall of the top electrode 22. Because the second portion $40_2$ of the conformal dielectric spacer 40 is disposed on the sidewall of the top electrode 22, the second portion $40_2$ of the conformal dielectric spacer 40 is also referred to herein as a sidewall conformal spacer $40_2$. As best seen in FIG. 5, in the illustrative example the second leg $40_2$ of the L-shaped cross-section of the conformal dielectric spacer 40 is perpendicular to the first leg $40_1$ of the L-shaped cross-section of the conformal dielectric spacer 40.

In the illustrative example of FIGS. 3 and 4, the structure including the bottom electrode 20, ferroelectric layer 24, and top electrode 22 has a circular perimeter, i.e. is rotationally symmetric about a central axis. However, more generally the structure can have other perimeter geometries, e.g. circular (as shown), oval, square, rectangular, hexagonal, octagonal, or so forth, and it will be appreciated that in any of these cases a section can be taken similarly to the Section indicated in FIG. 4 for which the inner conformal dielectric spacer 40 will have an L-shaped cross-section including the first and second legs $40_1$ and $40_2$ disposed on the peripheral area of the ferroelectric layer 24 and the sidewall of the top electrode 22, respectively.

Moreover, although not shown by perspective views, referencing FIG. 2 the outer conformal dielectric spacer 42 will similarly have an L-shaped cross-section, in this case including a first (e.g. horizontal) leg $42_1$ that is disposed on the SiC layer 30 and a second (e.g. vertical) leg $42_2$ that is disposed on a sidewall of the FTJ 10, including a portion thereof disposed on the sidewall of the ferroelectric layer 24.

Notably, the inner conformal dielectric spacer 40 includes the first leg $40_1$ that is in intimate contact (e.g. deposited directly onto) the peripheral area of the ferroelectric layer 24 (i.e., on the peripheral area $24_P$ indicated in FIG. 3). If the inner conformal dielectric spacer 40 is made of a material with a significantly lower coefficient of thermal expansion (CTE) than the CTE of the material of the ferroelectric layer 24, then during the ferroelectric phase crystallization by annealing the inner conformal dielectric spacer 40 (and especially the first leg $40_1$ thereof) is positioned to apply stress to the peripheral area $24_P$ of the ferroelectric layer 24 during the annealing. This stress is believed to promote formation of the ferroelectric phase during the annealing.

Similarly, the outer conformal dielectric layer 42 includes the second leg $42_2$ that is in intimate contact (e.g. deposited directly onto) the sidewall of the ferroelectric layer 24. If the outer conformal dielectric spacer 42 is made of a material with a significantly lower CTE than the CTE of the material of the ferroelectric layer 24, then during the ferroelectric phase crystallization by annealing the outer conformal dielectric spacer 42 (and especially the second leg $42_2$ thereof) is positioned to apply stress to the peripheral area $24_P$ of the ferroelectric layer 24 during the annealing (in this case, via the sidewall thereof). This stress is believed to promote formation of the ferroelectric phase during the annealing.

In further detail, the ferroelectric layer 24 is made of a ferroelectric material such as hafnium oxide doped with zinc, silicon, yttrium, aluminum, gadolinium, lanthanum, or strontium. As a specific example, when zinc is the dopant the material is sometimes referred to as hafnium zinc oxide (HZO), corresponding to a composition $Hf_{1-x}Zr_xO_2$ with x typically in a range of $0.4 \leq x \leq 0.7$. More generally, the composition could be $Hf_{1-x}D_xO_2$ where the dopant D can be zinc, silicon, yttrium, aluminum, gadolinium, lanthanum, or strontium, for example, and the composition fraction x is chosen to provide a desired ferroelectric property. In other embodiments, the ferroelectric layer 24 may comprise another type of ferroelectric material such as $SrBi_2Ta_2O_9$, $PbZr_xTi_{1-x}O_3$, or $BaTiO_3$. These are merely some nonlimiting illustrative examples.

In one fabrication process, the ferroelectric layer 24 in its as-deposited state is an amorphous material, or a polycrystalline or single crystal material with various crystal phases. For proper operation of the ferroelectric tunnel junction, a sufficient portion of the ferroelectric layer 24 should be in a ferroelectric crystal phase. For the example of HZO, a suitable ferroelectric crystal phase is an orthorhombic phase, which is non-centrosymmetric with oxygen atoms are arranged to be able to respond to form intrinsic polarizations in response to external electric fields, thereby being capable of being switched by application of electric field between positive remnant polarization (+Pr) and negative remnant polarization (−Pr) states. The ferroelectric behavior of the orthorhombic crystal phase of HZO is a consequence of its non-centrosymmetric However, the as-deposited layer 24 may be amorphous, or may have a mixture of phases, e.g. a mixture of tetragonal and/or monoclinic and/or orthorhombic crystal phases. Characterization techniques such as X-ray diffraction (XRD) and/or electron backscatter diffraction (EBSD) can be used to assess the fractional phases of the layer 24.

To perform as a ferroelectric tunnel junction, the ferroelectric layer 24 should have a sufficiently high fraction of its material in a ferroelectric crystal phase (e.g., in the orthorhombic phase in the case of HZO or some other hafnium oxide-based ferroelectric materials). To induce the material of the ferroelectric layer 24 into the appropriate ferroelectric crystal phase, ferroelectric phase crystallization by annealing is typically performed at a suitably high temperature for a sufficient time interval (e.g., ~550° C. for about 5 minutes may be sufficient in some cases). For examples in which the ferroelectric layer 24 comprises HZO (or another suitably doped hafnium oxide composition), the annealing promotes ferroelectric orthorhombic phase crystallization in the ferroelectric HZO layer 24. By way of nonlimiting illustrative example, the ferroelectric phase crystallization produced by the anneal may be at least 35% orthorhombic crystal phase, or at least 50% orthorhombic crystal phase, or at least 70% orthorhombic crystal phase, in some nonlimiting illustrative examples. The remainder of the HZO may, for example, be in a tetragonal phase and/or a monoclinic phase or so forth.

It is believed that ferroelectric phase crystallization during the annealing is promoted at least partly by the difference in CTE (hereinafter denoted as ΔCTE) between the CTE of ferroelectric layer 24 and the CTE of the surrounding material, such as the bottom electrode 20 and the top electrode 22. The ΔCTE imposes stress on the ferroelectric layer 24 which tends to preferentially bias the crystallization of the HZO material into the ferroelectric orthorhombic phase, over non-ferroelectric phases such as tetragonal or monoclinic phases.

However, as previously noted, because the top electrode 22 does not cover the peripheral area $24_P$ of the ferroelectric layer 24, the periphery would ordinarily be under less stress due to difference in CTE during the anneal process than the central portion of the ferroelectric layer 24. As just described, however, the inner conformal dielectric spacer 40 and/or the outer conformal dielectric spacer 42 can provide additional difference in CTE-induced stress to the peripheral area $24_P$ of the ferroelectric layer 24, so as to promote ferroelectric phase crystallization in the peripheral area $24_P$ of the ferroelectric layer 24 during the annealing, thereby improving uniformity in the ferroelectric phase percentage across the ferroelectric layer 24 and thereby improving FTJ performance, such as providing for lower electrical current leakage, more uniform capacitance, and/or so forth.

In some embodiments, the ratio of the CTE of the peripheral conformal spacer $40_1$ (and of the inner conformal spacer 40 as a whole) to the CTE of the ferroelectric layer is 0.67 or lower, as computed according to:

$$\Delta CTE = \frac{|CTE_{Fe} - CTE_{conformal\_spacer}|}{CTE_{Fe}} \times 100\% \tag{1}$$

where $CTE_{Fe}$ is the CTE of the ferroelectric material 24, and $CTE_{conformal\_spacer}$ is the CTE of the conformal spacer 40 (or of the outer conformal spacer 42, if that outer spacer 42 is providing the peripheral ferroelectric phase crystallization enhancement). As a non-limiting illustrative example, HZO has a CTE of about 30 µm/(m·K) while TaO has a CTE of about 3.6 µm/(m·K), that is, $\Delta CTE$ of about 88%. As another example, the spacer 40 (or spacer 42) could comprise aluminum oxide (AlO) having a CTE about 8.1, providing $\Delta CTE$ of about 73% respective to HZO. Other metal oxides, or other dielectric materials with suitable $\Delta CTE$, are contemplated for use as the spacer 40 and/or spacer 42, such as silicon nitride (SiN, CTE~3.3), silicon oxide (SiO$_x$, CTE~5.8), or so forth. Notably, because the conformal dielectric layer 40 is conformal and has intimate contact with the periphery of the ferroelectric layer 24 over its first portion $40_1$, it is capable of effectively applying stress to the periphery of the ferroelectric layer 24 due to the $\Delta CTE$ during the anneal. Likewise, because the outer conformal dielectric layer 42 is conformal and has intimate contact with the periphery of the ferroelectric layer 24 over its second portion $42_2$, it is capable of effectively applying stress to the periphery of the ferroelectric layer 24 due to the $\Delta CTE$ during the anneal. Hence, the inner conformal dielectric layer 40, the outer dielectric layer 42, or both, can be provided to effectively enhance ferroelectric phase crystallization in the periphery of the ferroelectric layer 24 during the anneal.

With returning reference to FIG. 1, in some embodiments transistors 8 are operatively connected with the FTJs 10 to form cells of a ferroelectric random access memory (Fe-RAM) array. Each illustrative FeRAM cell of FIG. 1 connects the FTJ 10 between the source (or drain) contact of a corresponding transistor 8 (which may, for example, comprise a field effect transistor, FET, or the like) and electrical ground. In the FeRAM, the FTJ 10 acts as a switchable capacitor whose capacitance depends on whether the ferroelectric layer 24 is in the positive remnant polarization (+Pr)

state or the negative remnant polarization (−Pr) state. The channel current of the transistor 8 can be controlled to switch the ferroelectric layer 24 of the FTJ 10 between the positive and negative remnant polarization states. In a typical FeRAM array, the transistors 8 of the FeRAM cells are fabricated during front end-of-line (FEOL) on the surface of and/or in the semiconductor substrate (e.g. semiconductor wafer, not shown), while the FTJ 10 and associated connectivity provided by the metallization layers $M_{x-1}$, $M_x$ and vias $V_{x-1}$ are typically fabricated during MEOL and/or BEOL processing. While the illustrative example of FIG. 1 operatively connects the channel of the transistor 8 with FTJ 10 to form an Fe-RAM cell, other designs are contemplated, such as an Fe-RAM in which the FTJ is sandwiched between the gate electrode and source-drain channel of the FET so that the variable capacitance of the FTJ adjusts the gate voltage. Thus, more generally a transistor 8 is operatively connected with the FTJ 10 to form the FeRAM cell.

Thus, the FTJ 10 described with reference to FIGS. 1-5 includes the bottom electrode 20, the top electrode 22, and the ferroelectric layer 24 disposed between the bottom electrode 20 and the top electrode 22. The peripheral area $24_P$ of the ferroelectric layer 24 is not covered by the top electrode 22 and surrounds the sidewall of the top electrode 22. A conformal dielectric spacer 40 is disposed on the peripheral area $24_P$ of the ferroelectric layer 24 and on the sidewall of the top electrode 22. The conformal dielectric spacer 40 has an L-shaped cross-section in a section of the FTJ 10. The L-shaped cross-section of the conformal dielectric spacer 40 includes a first leg $40_1$ corresponding to a first portion of the conformal dielectric spacer 40 that is disposed on the peripheral area $24_P$ of the ferroelectric layer 24, and a second leg $40_2$ corresponding to a second portion of the conformal dielectric spacer 40 disposed on the sidewall of the top electrode 22. Dielectric material 32 is disposed on the conformal dielectric spacer 40 and fills space between the first and second legs $40_1$ and $40_2$ of the L-shaped cross-section of the conformal dielectric spacer 40 in the section of the FTJ 10. The dielectric material 32 disposed on the conformal dielectric spacer 40 may, for example, comprise silicon oxynitride, while the conformal dielectric spacer 40 may, for example, comprise tantalum oxide or another metal oxide. In some embodiments, an outer conformal dielectric spacer 42 is disposed on a sidewall of the peripheral area $24_P$ of the ferroelectric layer 24 of the FTJ 10 and on the dielectric material 32 that is disposed on the conformal dielectric spacer 40.

In a device manufacturing method, the FTJ 10 is formed, including the bottom electrode 20, the top electrode 22, and the ferroelectric layer 24 disposed between the bottom electrode 20 and the top electrode 22. A peripheral area $24_P$ of the ferroelectric layer 24 is not covered by the top electrode 22, and surrounds the sidewall of the top electrode 22. The dielectric material 32 is disposed in the space between the peripheral area $24_P$ of the ferroelectric layer 24 and the sidewall of the top electrode 22. Additionally, at least one conformal metal oxide (or other dielectric) spacer 40 and/or 42 is deposited. This may include, prior to the disposing of the dielectric material 32, depositing the inner conformal metal oxide (or other dielectric) spacer 40 on the peripheral area $24_P$ of the ferroelectric layer 24 and on the sidewall of the top electrode 22. Additionally or alternatively, after the disposing of the dielectric material 32, depositing the outer conformal metal oxide (or other dielectric) spacer 42 on the dielectric material 32 and on the sidewall of the peripheral area $24_P$ of the ferroelectric layer 24. The FTJ 10 is annealed to induce ferroelectric phase crystallization in the ferroelectric layer 24 of the FTJ 10. The anneal is suitably performed after the depositing of the at least one conformal metal oxide (or other dielectric) layer 40 and/or 42, so that it can assist the ferroelectric phase crystallization in the peripheral area $24_P$ of the ferroelectric layer 24 during the anneal by way of applying stress due to the difference in CTE between the ferroelectric layer 24 and the at least one conformal metal oxide (or other dielectric) layer 40 and/or 42.

Figure 7:
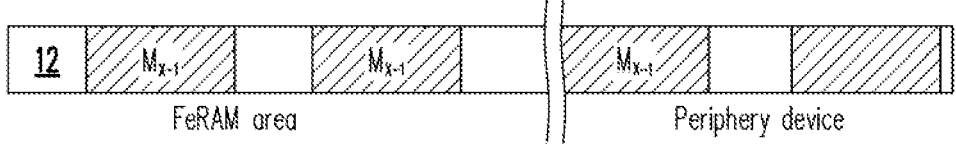
FIGS. 7-20 diagrammatically illustrate cross-sectional views of successive steps of the FTJ cell fabrication method of FIG. 2.
Figure 8:
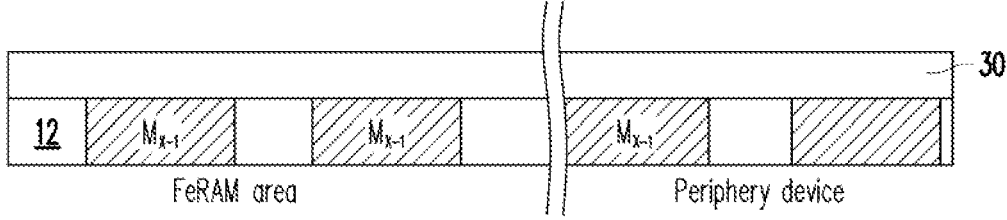
Figure 9:
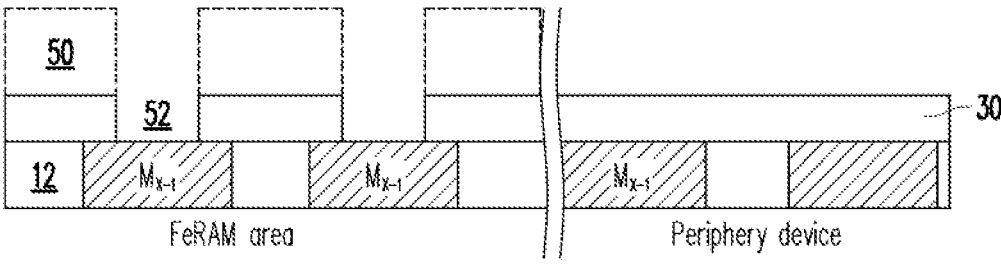
Figure 10:
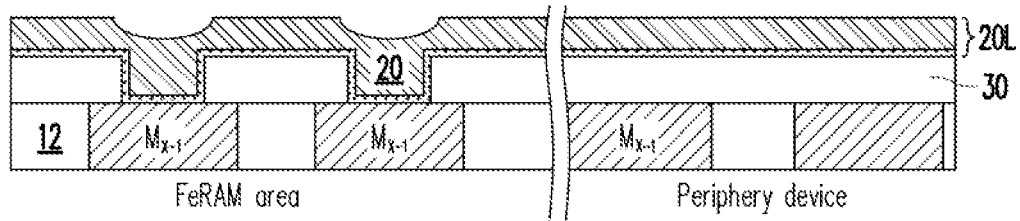
Figure 11:
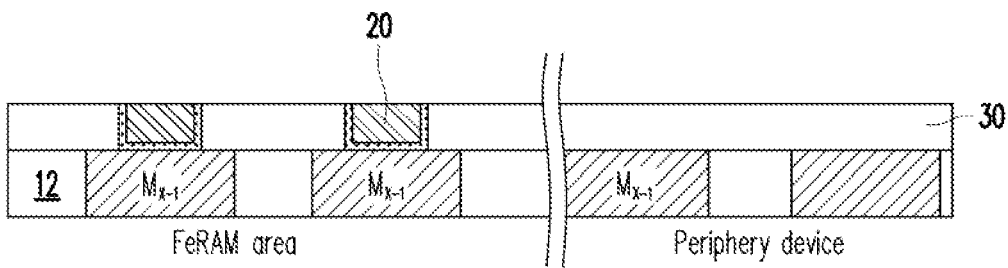
Figure 12:
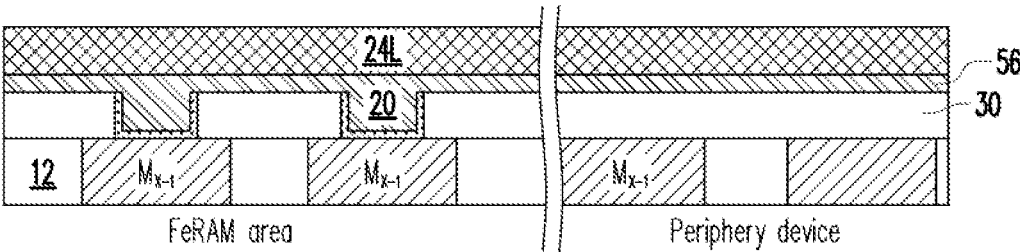
Figure 13:
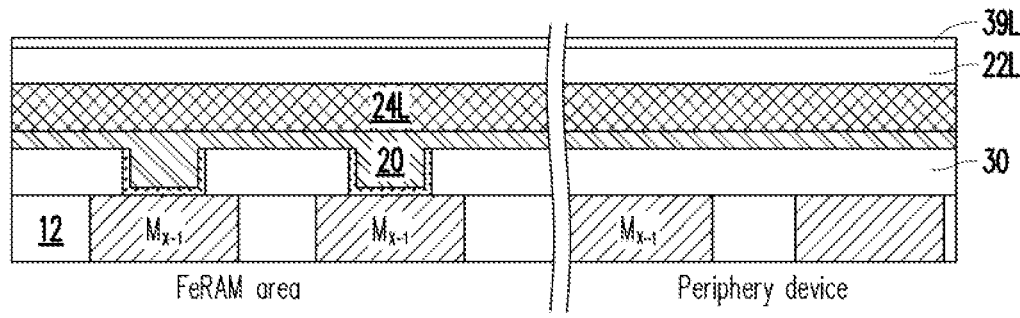

With reference now to FIGS. 6-20, an illustrative more detailed method of manufacturing a FTJ such as the FTJ 10 of FIGS. 1-5 is described. FIG. 6 presents a flowchart of the method, while FIGS. 7-20 present diagrammatic cross-sectional representations of the under-fabrication FTJ at various successive steps. Note that the left side of each of the cross-sectional diagrams of FIGS. 7-20 represents the FeRAM area where the FTJs 10 are being fabricated, while the right side represents a periphery device area where, for example, logic circuitry may be fabricated (details not shown in FIGS. 7-20). In a step S1 corresponding to the cross-sections of FIGS. 7-13, a base structure is formed including the bottom electrodes 20 electrically contacting a lower metallization layer $M_{x-1}$, a continuous ferroelectric layer 24L disposed over the bottom electrodes 20, and a top electrode layer 22L disposed over the continuous ferroelectric layer 24L. To this end, starting with the lower metallization layer $M_{x-1}$ and surrounding intermetal dielectric (IMD) 12 shown in FIG. 7, the SiC layer 30 is formed by chemical vapor deposition (CVD), physical vapor deposition (PVD), or the like, as shown in FIG. 8. Photolithographic patterning is performed to form a patterned photolithography mask 50 that is used to etch openings 52 in the SiC layer 30 as shown in FIG. 9. A bottom electrode layer 20L of TiN or (as shown) TiN disposed on a thin layer of TaN is formed which fills the openings 52, as shown in FIG. 10. Chemical mechanical polishing (CMP) is performed to remove the bottom electrode layer 20L except where it fills the openings 54 in the SiC layer 30, thereby completing formation of the bottom electrodes 20 as shown in FIG. 11. Thereafter, an optional additional TiN layer 56 is formed, followed by a continuous ferroelectric layer 24L as shown in FIG. 12. In some embodiments, the continuous ferroelectric layer 24L may include an interfacial layer, or may comprise a stack of two or more ferroelectric layers spaced apart by interfacial layers. Next, a top electrode layer 22L of TiN or another suitable electrical conductor is deposited, and an optional overlayer of SiON 39L or the like (which will be etched to form the SiON 39 of the FTJ 10 of FIG. 1).

Figure 14:
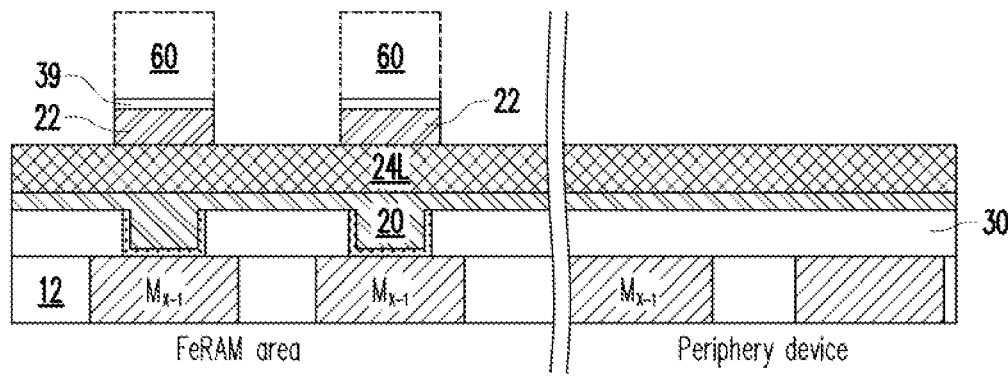

With continuing reference to FIG. 6, in a step S2 the top electrode layer 22L is patterned to form an array of the top electrodes 22 disposed on the continuous ferroelectric layer 24L. To this end, photolithographic patterning is performed to form a patterned photolithography mask 60 that is used to etch the SiON layer 39L to form the SiON 39 of the FTJ 10 of FIG. 1 and to etch the top electrode layer 22L to form the top electrodes 22, as shown in FIG. 14.

Figure 15:
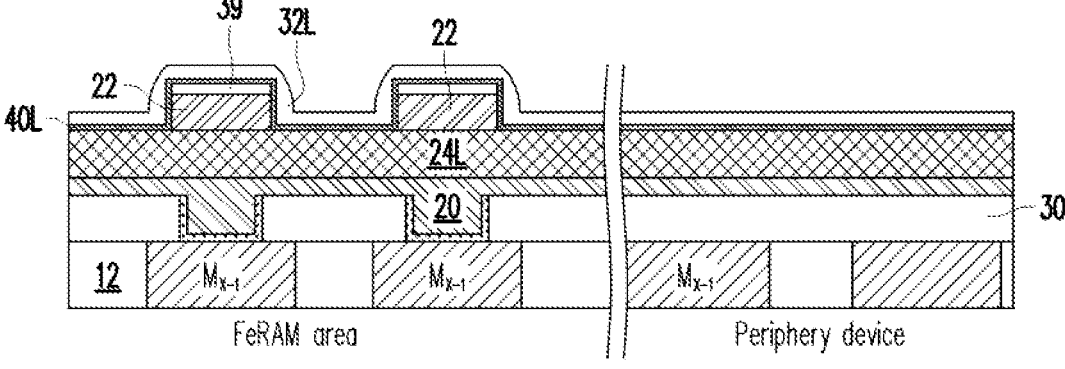

In a step S3, a conformal dielectric layer 40L is disposed on tops and sidewalls of the top electrodes 22 and on a surface of the continuous ferroelectric layer 24L between the top electrodes 22. In the illustrative example, additionally a nonconformal dielectric layer 32L is deposited on the conformal dielectric layer 40L, which will be the source of the dielectric material 32. The result is shown in FIG. 15.

Figure 16:
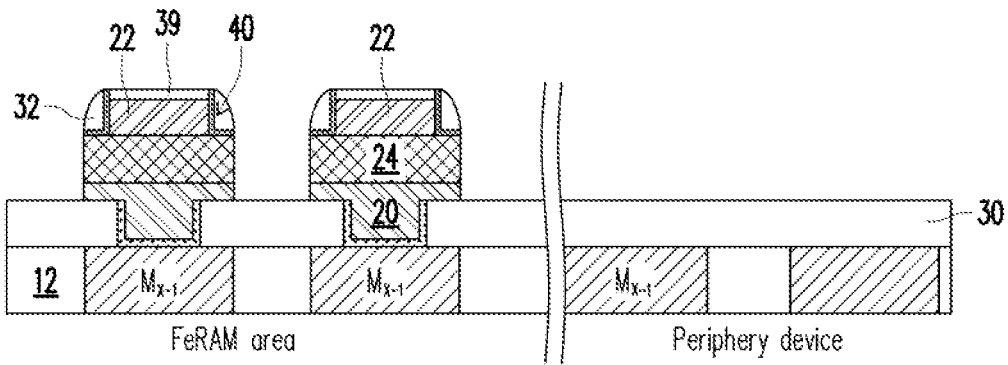

In a step S4 FTJ cells are formed, each including a top electrode 22 of the array of top electrodes, a bottom electrode 20, and a ferroelectric layer 24 formed from the continuous ferroelectric layer 24L. The result is shown in FIG. 16. Photolithographic patterning or the like is suitably performed to remove the portions of the ferroelectric layer 24L and the conformal dielectric layer 40L and the nonconformal dielectric layer 32L between the FTJ cells, thereby leaving the ferroelectric layer 24, the conformal spacer 40, and the dielectric material 32 of each FTJ cell 10 as shown in FIG. 16. In some embodiments, the etching is performed using a chlorine or fluorine etch, by way of nonlimiting illustrative example. In this process, the dielectric material 32 on the sidewall conformal spacer $40_2$ and on the peripheral conformal spacer $40_1$ of each FTJ cell (see enlarged view of FIG. 2) may serve to prevent removal of the sidewall conformal spacer $40_2$ and the peripheral conformal spacer $40_1$ during the etching to form the FTJ cells 10. Alternatively, photolithographic masking may protect the sidewall conformal spacer $40_2$ and peripheral conformal spacer $40_1$.

Figure 17:
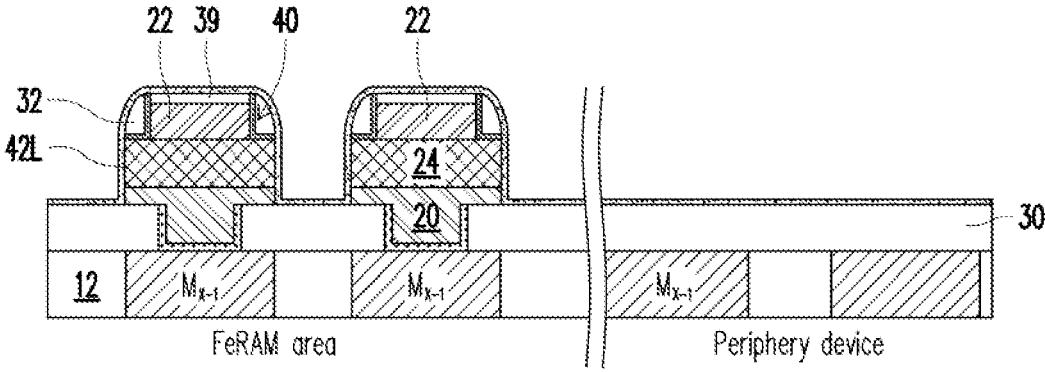
Figure 18:
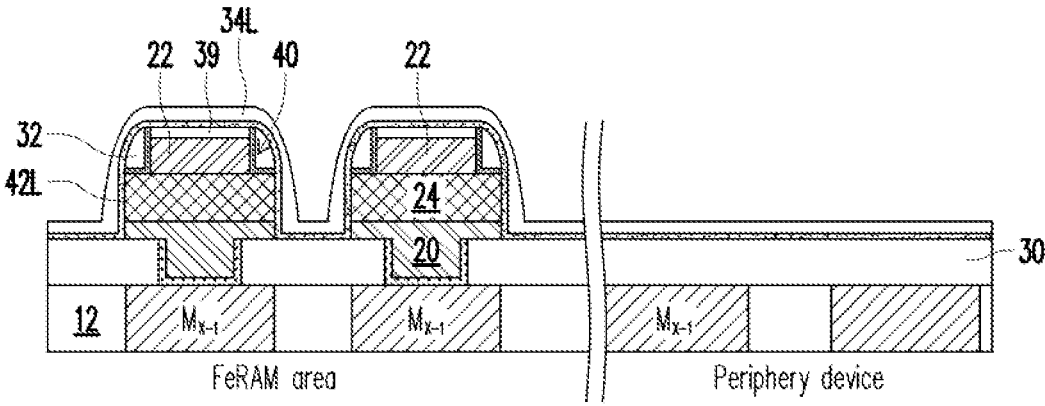
Figure 19:
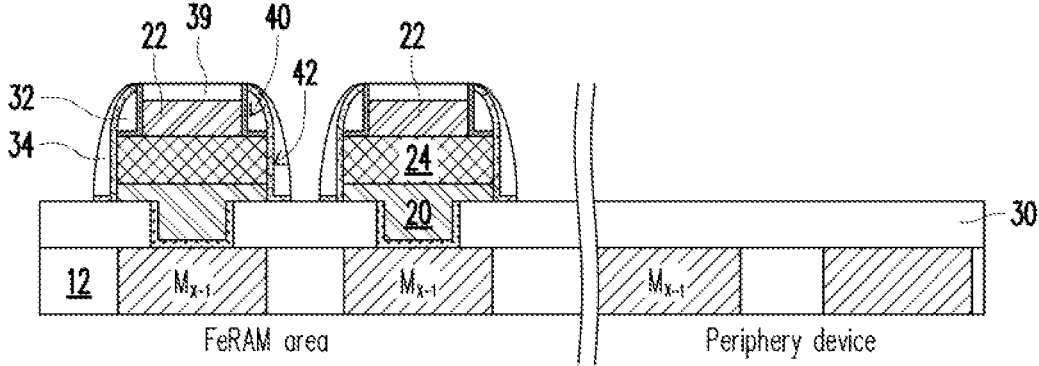
Figure 20:
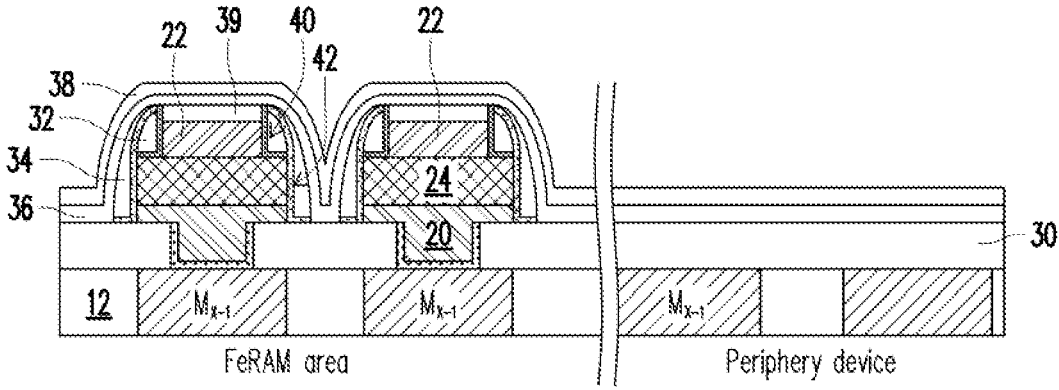
Figure 24:
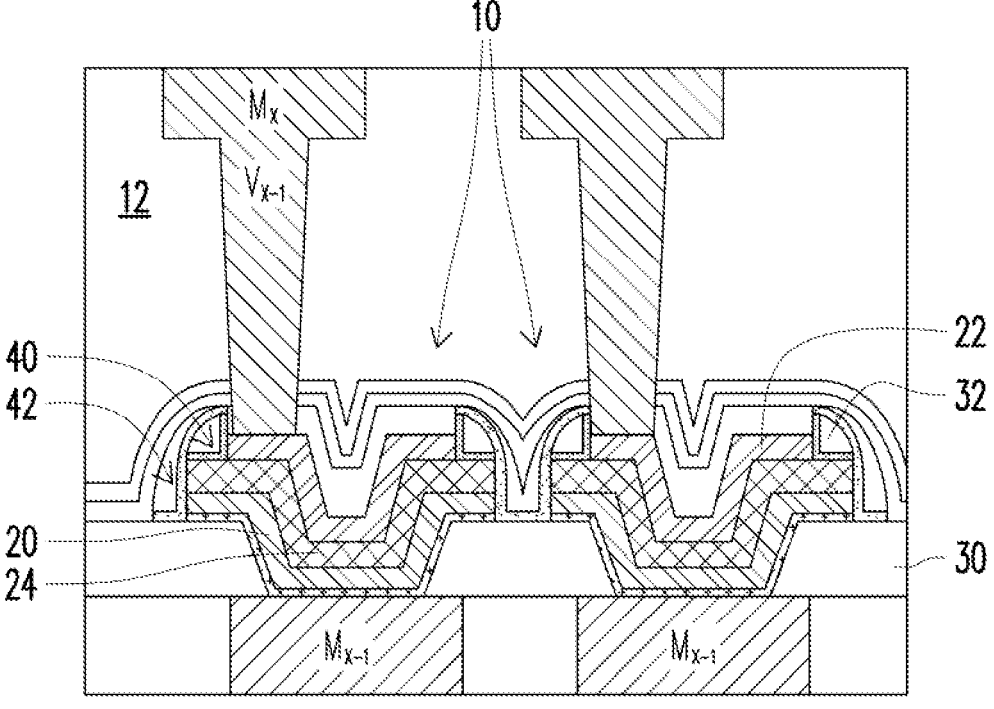
Figures 25, 26:
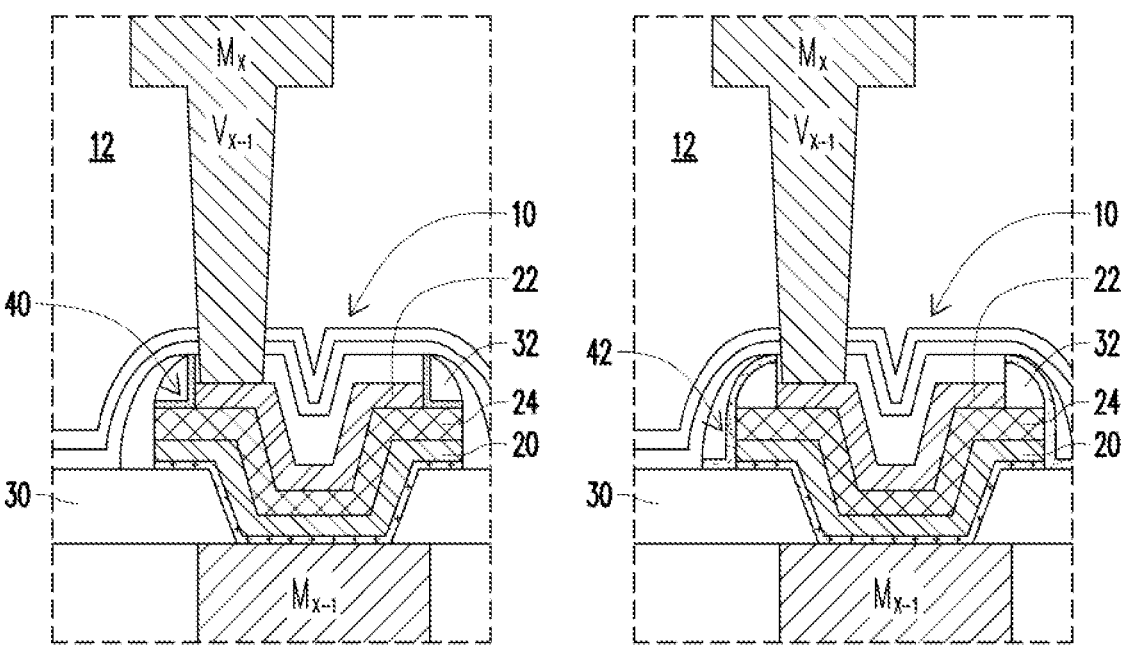
Figure 27:
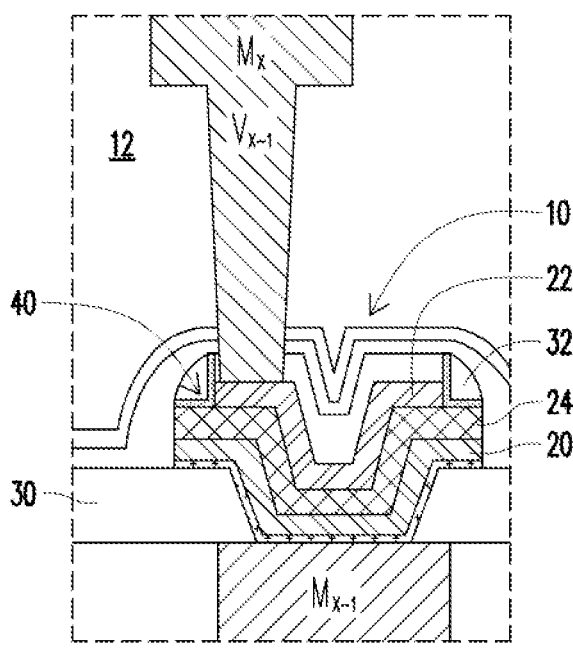

In a step S5, the outer conformal dielectric spacer 42 is formed on sidewalls of the formed FTJ cells 10 including on the dielectric material 32 disposed on the sidewall conformal spacer $40_2$ and on the peripheral conformal spacer $40_1$ of each FTJ cell 10. To this end, a conformal dielectric layer 42L is deposited over the entire surface including the FTJs 10 and the areas therebetween. The result is shown in FIG. 17. Optionally, an additional dielectric layer 34L may be deposited on top of the conformal dielectric layer 42L. The result is shown in FIG. 18. Photolithographic patterning or the like is suitably performed to remove the portions of the layers 42L and 32L between the FTJs 10, leaving the outer conformal dielectric spacer 42 and the dielectric spacer 34 as shown in FIG. 19. Optionally, the outermost tetraethoxysilane (TEOS) 38 is then deposited as shown in FIG. 20.

Thereafter, in a step S6 indicated in FIG. 6, the ferroelectric phase crystallization anneal is performed. As previously discussed, the conformal dielectric spacers 40 and 42 provide stress during the anneal to promote formation of the ferroelectric phase at the periphery of the ferroelectric layer 24.

In a step S7, the top metallization is performed, including depositing IMD 12, photolithographically defining via openings and filling with the vias $V_{x-1}$ and depositing the metal layer $M_x$. While FIG. 6 illustrates the top metallization step S7 being performed after the ferroelectric phase crystallization anneal step S6, in a variant embodiment the top metallization step S7 may be performed before the ferroelectric phase crystallization anneal step S6.

With reference now to FIGS. 21-27, the disclosed approach of employing the inner conformal dielectric spacer 40 and/or the outer conformal dielectric spacer 42 to promote formation of the ferroelectric phase at the periphery of the ferroelectric layer 24 and enhance isolation of the FeRAM cells is applicable to other FTJ designs, seven further examples of which are illustrated by way of cross-sectional view in FIGS. 21-27. The various components, e.g. the bottom electrode 20, top electrode 22, ferroelectric layer 24, and so forth, as well as the inner conformal dielectric spacer 40 and/or the outer conformal dielectric spacer 42 are labeled as in FIGS. 1-5 and are not further described here.

FIG. 21 illustrates an FTJ with a vertical architecture similar to that of the FTJ 10 of FIG. 1. However, the FTJ of FIG. 21 differs from the FTJ 10 of FIG. 1 in that it only includes the inner conformal dielectric spacer 40, but omits the outer conformal dielectric spacer 42.

FIG. 22 illustrates an FTJ with a vertical architecture similar to that of the FTJ 10 of FIG. 1. However, the FTJ of FIG. 22 differs from the FTJ 10 of FIG. 1 in that it only includes the outer conformal dielectric spacer 42, but omits the inner conformal dielectric spacer 40.

FIG. 23 illustrates an FTJ with a vertical architecture similar to that of the FTJ 10 of FIG. 1, and includes both conformal dielectric spacers 40 and 42. However, the FTJ of FIG. 21 differs from the FTJ 10 of FIG. 1 in that it omits the dielectric material 34 coating the outer conformal dielectric spacer 42.

FIGS. 24-27 depicts an FTJ with a different architecture than the FTJ 10 of FIG. 1. This architecture enables omission of the CMP step between FIGS. 10 and 11 of the fabrication sequence previously described. The FTJ of FIG. 24 includes both the inner conformal dielectric spacer 40 and the outer conformal dielectric spacer 42. The FTJ of FIG. 25 only includes the inner conformal dielectric spacer 40, but omits the outer conformal dielectric spacer 42. The FTJ of FIG. 26 only includes the outer conformal dielectric spacer 42, but omits the inner conformal dielectric spacer 40. The FTJ of FIG. 27 includes both conformal dielectric spacers 40 and 42, but omits the dielectric material 34 coating the outer conformal dielectric spacer 42.

In the illustrative examples, the conformal dielectric spacer(s) 40 and/or 42 are employed to improve a ferroelectric tunnel junction (FTJ). However, the approach can be more generally applied to a magnetoresistive tunnel junction (MTJ), which may for example be used in a magnetoresistive random access memory (MRAM).

In the following, some further embodiments are described.

In a nonlimiting illustrative embodiment, a method of manufacturing a device is disclosed. The method includes: forming bottom electrodes electrically contacting a lower metallization layer, a continuous ferroelectric layer disposed over the bottom electrodes, and a top electrode layer disposed over the continuous ferroelectric layer; patterning the top electrode layer to form an array of top electrodes disposed on the continuous ferroelectric layer; disposing a conformal dielectric layer on tops and sidewalls of the top electrodes and on a surface of the continuous ferroelectric layer between the top electrodes; forming FTJ cells each including a top electrode of the array of top electrodes, a bottom electrode, and a ferroelectric layer formed from the continuous ferroelectric layer; and annealing to induce ferroelectric phase crystallization in the ferroelectric layers of the formed FTJ cells. A peripheral area of the ferroelectric layer of each formed FTJ cell is not covered by the top electrode and surrounds the sidewall of the top electrode. Each formed FTJ cell further includes a sidewall conformal spacer comprising the portion of the conformal dielectric layer disposed on the sidewall of the top electrode and a peripheral conformal spacer comprising the portion of the conformal dielectric layer disposed on the peripheral area of the ferroelectric layer.

In a nonlimiting illustrative embodiment, a device is disclosed, comprising: a ferroelectric tunnel junction (FTJ) including a bottom electrode, a top electrode, and a ferroelectric layer disposed between the bottom electrode and the top electrode, wherein a peripheral area of the ferroelectric layer is not covered by the top electrode and surrounds a sidewall of the top electrode; and a conformal dielectric spacer disposed on the peripheral area of the ferroelectric layer and on the sidewall of the top electrode. The conformal dielectric spacer has an L-shaped cross-section in a section of the FTJ, the L-shaped cross-section of the conformal dielectric spacer including a first leg corresponding to a first portion of the conformal dielectric spacer disposed on the peripheral area of the ferroelectric layer and a second leg corresponding to a second portion of the conformal dielectric spacer disposed on the sidewall of the top electrode.

In a nonlimiting illustrative embodiment, a method of manufacturing a device is disclosed. The method includes: forming a ferroelectric tunnel junction (FTJ) including a bottom electrode, a top electrode, and a ferroelectric layer disposed between the bottom electrode and the top electrode, wherein a peripheral area of the ferroelectric layer is not covered by the top electrode and surrounds a sidewall of the top electrode; disposing a dielectric material in a space between the peripheral area of the ferroelectric layer and a sidewall of the top electrode; depositing at least one conformal metal oxide spacer; and annealing the FTJ to induce ferroelectric phase crystallization in the ferroelectric layer of the FTJ. The depositing at least one conformal metal oxide spacer includes at least one of: (i) prior to the disposing of the dielectric material, depositing an inner conformal metal oxide spacer on the peripheral area of the ferroelectric layer and on the sidewall of the top electrode, and/or (ii) after the disposing of the dielectric material, depositing an outer conformal metal oxide spacer on dielectric material and on a sidewall of the peripheral area of the ferroelectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a device, the method comprising:
   forming bottom electrodes electrically contacting a lower metallization layer, a continuous ferroelectric layer disposed over the bottom electrodes, and a top electrode layer disposed over the continuous ferroelectric layer;
   patterning the top electrode layer to form an array of top electrodes disposed on the continuous ferroelectric layer;
   disposing a conformal dielectric layer on tops and sidewalls of the top electrodes and on a surface of the continuous ferroelectric layer between the top electrodes;
   forming ferroelectric tunnel junction (FTJ) cells each including a top electrode of the array of top electrodes, a bottom electrode, and a ferroelectric layer formed from the continuous ferroelectric layer; and
   annealing to induce ferroelectric phase crystallization in the ferroelectric layers of the formed FTJ cells;
   wherein a peripheral area of the ferroelectric layer of each formed FTJ cell is not covered by the top electrode and surrounds the sidewall of the top electrode; and
   wherein each formed FTJ cell further includes a sidewall conformal spacer comprising the portion of the conformal dielectric layer disposed on the sidewall of the top electrode and a peripheral conformal spacer comprising the portion of the conformal dielectric layer disposed on the peripheral area of the ferroelectric layer.

2. The method of claim 1 wherein the peripheral conformal spacer of each FTJ cell applies stress to the peripheral area of the ferroelectric layer during the annealing.

3. The method of claim 2 wherein a ratio of a coefficient of thermal expansion of the peripheral conformal spacer to a coefficient of thermal expansion of the ferroelectric layer is 0.67 or lower.

4. The method of claim 1 further comprising:

disposing dielectric material on the sidewall conformal spacer and on the peripheral conformal spacer of each FTJ cell.

5. The method of claim 4 further comprising:

forming an outer conformal dielectric spacer on sidewalls of the formed FTJ cells including on the dielectric material disposed on the sidewall conformal spacer and on the peripheral conformal spacer of each FTJ cell;

wherein the annealing is performed after the forming of the outer conformal dielectric spacer; and wherein the outer conformal dielectric spacer applies stress to the peripheral area of the ferroelectric layer during the annealing.

6. The method of claim 4 wherein the conformal dielectric layer comprises a metal oxide layer and the dielectric material disposed on the sidewall conformal spacer and on the peripheral conformal spacer of each FTJ cell comprises a silicon oxynitride.

7. The method of claim 1 wherein the conformal dielectric layer comprises a conformal metal oxide layer.

8. The method of claim 1 wherein the conformal dielectric layer comprises a conformal tantalum oxide (TaO) layer.

9. The method of claim 1 wherein the continuous ferroelectric layer comprises:

a continuous hafnium oxide layer that is doped with zinc, silicon, yttrium, aluminum, gadolinium, lanthanum, or strontium, or a continuous $SrBi_2Ta_2O_9$ layer, or a continuous $PbZr_xTi_{1-x}O_3$ layer, or a continuous $BaTiO_3$ layer.

10. The method of claim 1 further comprising:

forming an upper metallization layer electrically contacting the top electrodes of the formed FTJ cells.

11. The method of claim 10 wherein the annealing is performed before the forming of the upper metallization layer.

12. The method of claim 10 further comprising:

fabricating transistors;

wherein the fabricated transistors are electrically connected with the formed FTJ cells via the upper and lower metallization layers to form a ferroelectric random access memory array.

13. A method of manufacturing a device, the method comprising:

forming a ferroelectric tunnel junction (FTJ) including a bottom electrode, a top electrode, and a ferroelectric layer disposed between the bottom electrode and the top electrode, wherein a peripheral area of the ferroelectric layer is not covered by the top electrode and surrounds a sidewall of the top electrode;

disposing a dielectric material in a space between the peripheral area of the ferroelectric layer and a sidewall of the top electrode;

depositing at least one conformal metal oxide spacer including at least one of:

prior to the disposing of the dielectric material, depositing an inner conformal metal oxide spacer on the peripheral area of the ferroelectric layer and on the sidewall of the top electrode, and/or after the disposing of the dielectric material, depositing an outer conformal metal oxide spacer on dielectric material and on a sidewall of the peripheral area of the ferroelectric layer; and annealing the FTJ to induce ferroelectric phase crystallization in the ferroelectric layer of the FTJ.

14. The method of claim 13 wherein the annealing is performed after the depositing of the at least one conformal metal oxide layer.

15. A method of manufacturing a device, the method comprising:

forming a ferroelectric tunnel junction (FTJ) cell including bottom electrode, a ferroelectric layer disposed on the bottom electrode, and a top electrode disposed on the ferroelectric layer, wherein a peripheral area of the ferroelectric layer is not covered by the top electrode;

disposing a conformal dielectric layer on a top and sidewall of the top electrode and on a surface of the peripheral area of the ferroelectric layer that is not covered by the top electrode; and annealing to induce ferroelectric phase crystallization in the ferroelectric layer;

wherein a ratio of a coefficient of thermal expansion (CTE) of the conformal dielectric layer to a CTE of the ferroelectric layer is 0.67 or lower, and the portion of the conformal dielectric layer disposed on the surface of the peripheral area of the ferroelectric layer applies CTE difference-induced stress to the peripheral area of the ferroelectric layer during the annealing.

16. The method of claim 15 further comprising:

disposing dielectric material on the portions of the conformal dielectric layer disposed on the surface of the peripheral area of the ferroelectric layer and on the sidewall of the top electrode.

17. The method of claim 16 further comprising:

forming an outer conformal dielectric spacer on sidewalls of the FTJ cell including on the dielectric material disposed on the surface of the peripheral area of the ferroelectric layer and on the sidewall of the top electrode;

wherein the annealing is performed after the forming of the outer conformal dielectric spacer; and wherein the outer conformal dielectric spacer also applies stress to the peripheral area of the ferroelectric layer during the annealing.

18. The method of claim 16 wherein:

the conformal dielectric layer comprises a metal oxide layer; and the dielectric material disposed on the surface of the peripheral area of the ferroelectric layer and on the sidewall of the top electrode comprises a silicon oxynitride.

19. The method of claim 15 wherein:

the conformal dielectric layer comprises a conformal metal oxide layer; and the ferroelectric layer comprises a $SrBi_2Ta_2O_9$ layer, a $PbZr_xTi_{1-x}O_3$ layer, a $BaTiO_3$ layer, or a hafnium oxide layer that is doped with zinc, silicon, yttrium, aluminum, gadolinium, lanthanum, or strontium.

20. The method of claim 15 further comprising:

fabricating a transistor operatively connected with the FTJ cell to form a ferroelectric random access memory (FeRAM) cell.

* * * * *